(12) United States Patent
Liu et al.

(10) Patent No.: US 8,993,446 B2
(45) Date of Patent: Mar. 31, 2015

(54) METHOD OF FORMING A DIELECTRIC FILM

(71) Applicant: GLOBALFOUNDRIES Inc., Grand Cayman (KY)

(72) Inventors: Hung-Wei Liu, Saratoga Springs, NY (US); Tsung-Liang Chen, Cohoes, NY (US); Huang Liu, Mechanicville, NY (US); Zhiguo Sun, Halfmoon, NY (US)

(73) Assignee: GLOBALFOUNDRIES Inc., Cayman Islands (KY)

( * ) Notice: Subject to any disclaimer, the term of this patent is extended or adjusted under 35 U.S.C. 154(b) by 7 days.

(21) Appl. No.: 13/868,412

(22) Filed: Apr. 23, 2013

(65) Prior Publication Data

US 2014/0315385 A1    Oct. 23, 2014

(51) Int. Cl.
  *H01L 21/311* (2006.01)
  *H01L 21/02* (2006.01)
(52) U.S. Cl.
  CPC .................................. *H01L 21/0228* (2013.01)

USPC .............. 438/699; 438/694; 438/787; 216/97

(58) Field of Classification Search
  CPC ..................... H01L 21/0228; H01L 21/02323; H01L 21/02403
  USPC .......... 438/692, 697, 699, 759, 751, 778, 787; 216/88, 90, 97
  See application file for complete search history.

(56) References Cited

U.S. PATENT DOCUMENTS

| | | | |
|---|---|---|---|
| 6,228,781 B1 * | 5/2001 | Murugesh et al. | 438/784 |
| 7,097,886 B2 * | 8/2006 | Moghadam et al. | 427/569 |
| 2004/0224094 A1 * | 11/2004 | Lee et al. | 427/387 |
| 2009/0137094 A1 * | 5/2009 | Lee | 438/424 |

* cited by examiner

*Primary Examiner* — Lan Vinh
(74) *Attorney, Agent, or Firm* — Williams Morgan, P.C.

(57) ABSTRACT

A method for flowable oxide deposition is provided. An oxygen source gas is increased as a function of time or film depth to change the flowable oxide properties such that the deposited film is optimized for gap fill near a substrate surface where high aspect ratio shapes are present. The oxygen gas flow rate increases as the film depth increases, such that the deposited film is optimized for planarization quality at the upper regions of the deposited film.

7 Claims, 7 Drawing Sheets

METHOD OF FORMING A DIELECTRIC FILM

FIELD OF THE INVENTION

The present invention relates generally to semiconductor fabrication and, more particularly, to methods of forming a dielectric film.

BACKGROUND

In order to provide integrated circuits (ICs) with increased performance, the characteristic dimensions of devices and spacing on the ICs continue to be decreased. Fabrication of such devices often requires the deposition of dielectric materials into features patterned into layers of material on silicon substrates. In most cases, it is important that the dielectric material completely fill such features. Filling such narrow features, so-called gap filling, places stringent requirements on materials used, for example, for pre-metal dielectric (PMD) applications. The pre-metal dielectric layer on an integrated circuit isolates structures electrically from metal interconnect layers and isolates them electrically from contaminant mobile ions that degrade electrical performance. PMD layers may require filling narrow gaps having aspect ratios (that is the ratio of depth to width), of five or greater. Dielectric films play an important role in the fabrication of semiconductor devices. It is therefore desirable to have improved processes for the deposition of dielectric films.

SUMMARY OF THE INVENTION

In a first aspect, the present invention provides a method of forming a dielectric film comprising: depositing a flowable oxide on a semiconductor structure in a first phase having a first oxygen flow rate for a first time interval; depositing a flowable oxide on a semiconductor structure in a second phase having a second oxygen flow rate for a second time interval; depositing a flowable oxide on a semiconductor structure in a third phase having a third oxygen flow rate for a third time interval, wherein the second oxygen flow rate is greater than the first oxygen flow rate, and wherein the third oxygen flow rate is greater than the second oxygen flow rate.

In a second aspect, the present invention provides a method of forming a dielectric film comprising: depositing a flowable oxide on a semiconductor structure in a first phase having a first oxygen flow rate for a first time interval; depositing a flowable oxide on a semiconductor structure in a second phase having a second oxygen flow rate for a second time interval; depositing a flowable oxide on a semiconductor structure in a third phase having a third oxygen flow rate for a third time interval, wherein the first oxygen flow rate is zero, and wherein the second oxygen flow rate and the third oxygen flow rate increase based on a piecewise linear function.

In a third aspect, the present invention provides a method of forming a dielectric film comprising: depositing a flowable oxide on a semiconductor structure, wherein oxygen gas is flowed at a monotonically increasing flow rate up to an upper flow limit.

BRIEF DESCRIPTION OF THE DRAWINGS

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

Features of this invention will be more readily understood from the following detailed description of the various aspects of the invention taken in conjunction with the accompanying drawings in which.

DETAILED DESCRIPTION

Exemplary embodiments will now be described more fully herein with reference to the accompanying drawings, in which exemplary embodiments are shown. Embodiments of the present invention provide an improved method for flowable oxide deposition. An oxygen source gas is increased as a function of time or film depth to change the flowable oxide properties such that the deposited film is optimized for gap fill near a substrate surface where high aspect ratio shapes are present. The oxygen gas flow rate increases as the film depth increases, such that the deposited film is optimized for planarization quality at the upper regions of the deposited film.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g. a second layer), wherein intervening elements, such as an interface structure (e.g. interface layer), may be present between the first element and the second element.

Figure 1:
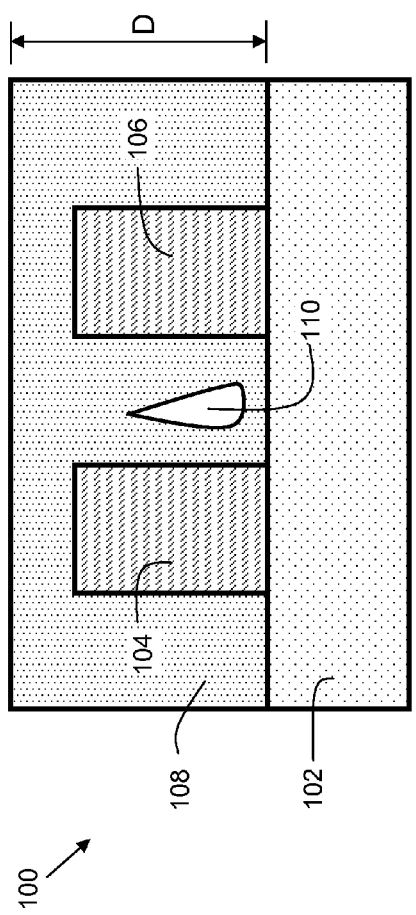
FIG. 1 is a semiconductor structure including a dielectric film with a gap.

FIG. 1 shows an example of a semiconductor structure 100 including a dielectric film 108 with poor gap fill quality. Semiconductor structure 100 comprises a substrate 102, which may be a bulk substrate such as a silicon wafer. Structures 104 and 106 are formed on the substrate 102. Structures 104 and 106 may be transistor gates, or part of other elements such as resistors or diodes. A dielectric film 108 is deposited on the structure 100 to a depth D, after which point, a planarization process, such as chemical mechanical polish (CMP) may be performed. However, due to the narrow gap between structure 104 and structure 106, a gap 110 is formed between structure 104 and 106. This gap is undesirable for a variety of reasons, which include device variability and reduced product yield.

Figure 2:
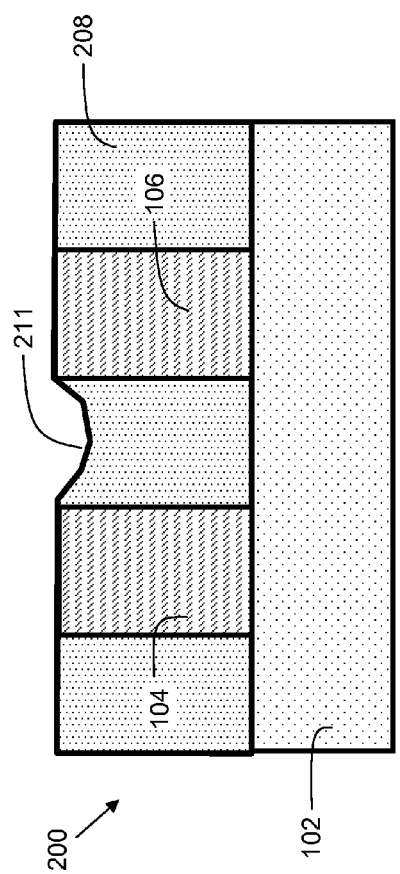
FIG. 2 is a semiconductor structure including a dielectric film with dishing.

FIG. 2 shows an example of a semiconductor structure 200 including a dielectric film 208 with good gap fill quality. Dielectric film 200 may be formed from a flowable oxide (FOX). Flowable oxide may be used as a dielectric film due to its good gap fill properties. Generally, the flowable oxide is deposited using chemical vapor deposition (CVD) such as plasma enhanced CVD (PECVD). The flowable oxide may include, but is not limited to, boron-doped silicon oxide, phosphorus-doped silicon oxide, boron phosphorus silicon glass (BPSG), phosphorus silicon glass (PSG), fluorinated silicate glass (FSG), and combinations thereof.

As used herein, the term "flowable oxide" is a flowable doped or undoped silicon oxide film having flow characteristics that provide consistent fill of a gap. The flowable oxide film may also be described as a soft jelly-like film, a gel having liquid flow characteristics, a liquid film, or a flowable film. The flowable oxide deposition methods described herein are not limited to a particular reaction mechanism (e.g., the reaction mechanism may involve an adsorption reaction, a hydrolysis reaction, a condensation reaction, a polymerization reaction, a vapor-phase reaction producing a vapor-phase product that condenses, condensation of one or more of the reactants prior to reaction, or a combination of these). The substrate is exposed to the process gases for a period sufficient to deposit a flowable film to fill at some of the gaps. The deposition process typically forms soft jelly-like film with good flow characteristics, providing consistent fill. However, flowable oxide films may suffer from poor planarization quality (PQ). After deposition of the film is complete, it is often desirable to planarize the film to a desired depth. Therefore, the flowable oxide film may be prone to "dishing" such as shown by region 211 of FIG. 2, where the top surface of dielectric 208 is not planar. This dishing is also undesirable because it can induce device variability and reduce product yield. In current processes, multiple depositions of various processes, with multiple planarization processes in between the depositions, may be performed in order to have a region of dielectric layers with good gap fill quality and also have acceptable PQ.

Embodiments of the present invention provide a dielectric formation method that utilizes flowable oxide in a single deposition process with a single planarization process. The method provides a flowable oxide that has good gap fill properties, and also has good planarization quality. The gap fill quality is most critical near the base of a high-aspect ratio feature, where gap fill may be difficult. Reducing or omitting oxygen gas flow into the deposition tool reaction chamber during the initial stages of deposition allows the flowable oxide to retain the good gap fill capabilities. As the depth of the flowable oxide increases, and exceeds the height of the high aspect ratio features, the planarization quality (PQ) becomes more important. At a higher depth, the flow of oxygen gas is increased. The effect of increased oxygen gas on the flowable oxide decreases the gap fill quality, but increases the PQ. However, with the depth of the flowable oxide exceeding the height where deep gaps exist, the gap fill properties are not as important, while the planarization quality becomes more important. Hence, embodiments of the present invention mitigate the tradeoff between gap fill quality and planarization quality, allowing a single deposition process to be used for a pre-metal dielectric film, saving considerable manufacturing cost over prior art methods.

Figure 3:
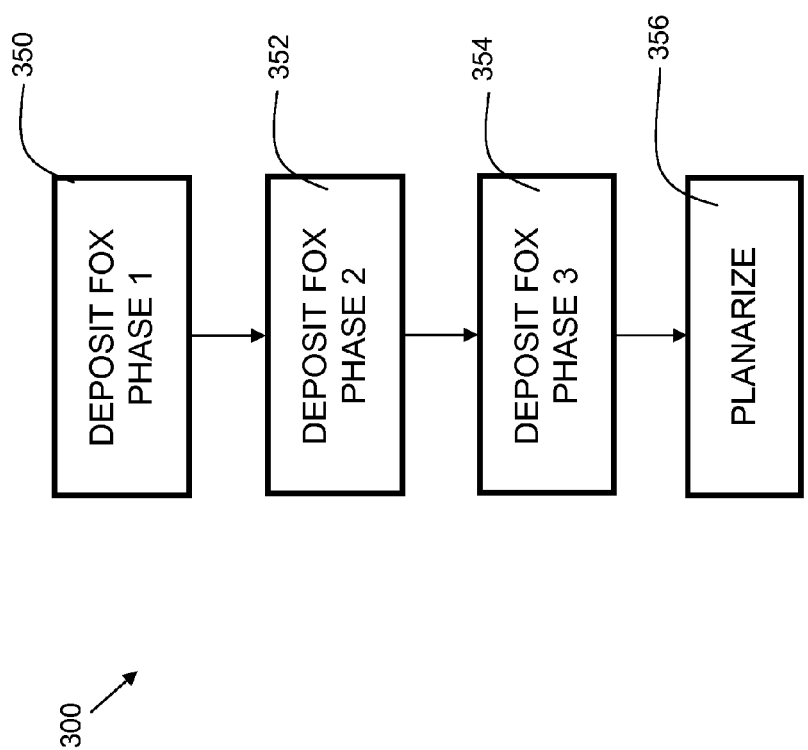
FIG. 3 is a flowchart indicating process steps for illustrative embodiments.

FIG. 3 is a flowchart 300 showing process steps for embodiments of the present invention. In process step 350, flowable oxide is deposited in a first phase. The first phase includes first oxygen flow rate for a first time interval. In some embodiments, the first oxygen flow rate is zero. In some embodiments, the first time interval ranges from about 5 seconds to about 15 seconds. In process step 352, flowable oxide is deposited in a second phase. The second phase includes a second oxygen flow rate for a second time interval. In some embodiments, the second oxygen flow rate ranges from about 50 standard cubic centimeters per minute (sccm) to about 90 sccm. In some embodiments, the second time interval ranges from about 20 seconds to about 30 seconds. In process step 354, flowable oxide is deposited in a third phase. The third phase includes a third oxygen flow rate for a third time interval. In some embodiments, the third oxygen flow rate ranges from about 110 standard cubic centimeters per minute (sccm) to about 160 sccm. In some embodiments, the third time interval ranges from about 20 seconds to about 30 seconds. In process step 356, a planarization process is performed on the deposited flowable oxide. The planarization process may include chemical mechanical polish (CMP).

Figure 4:
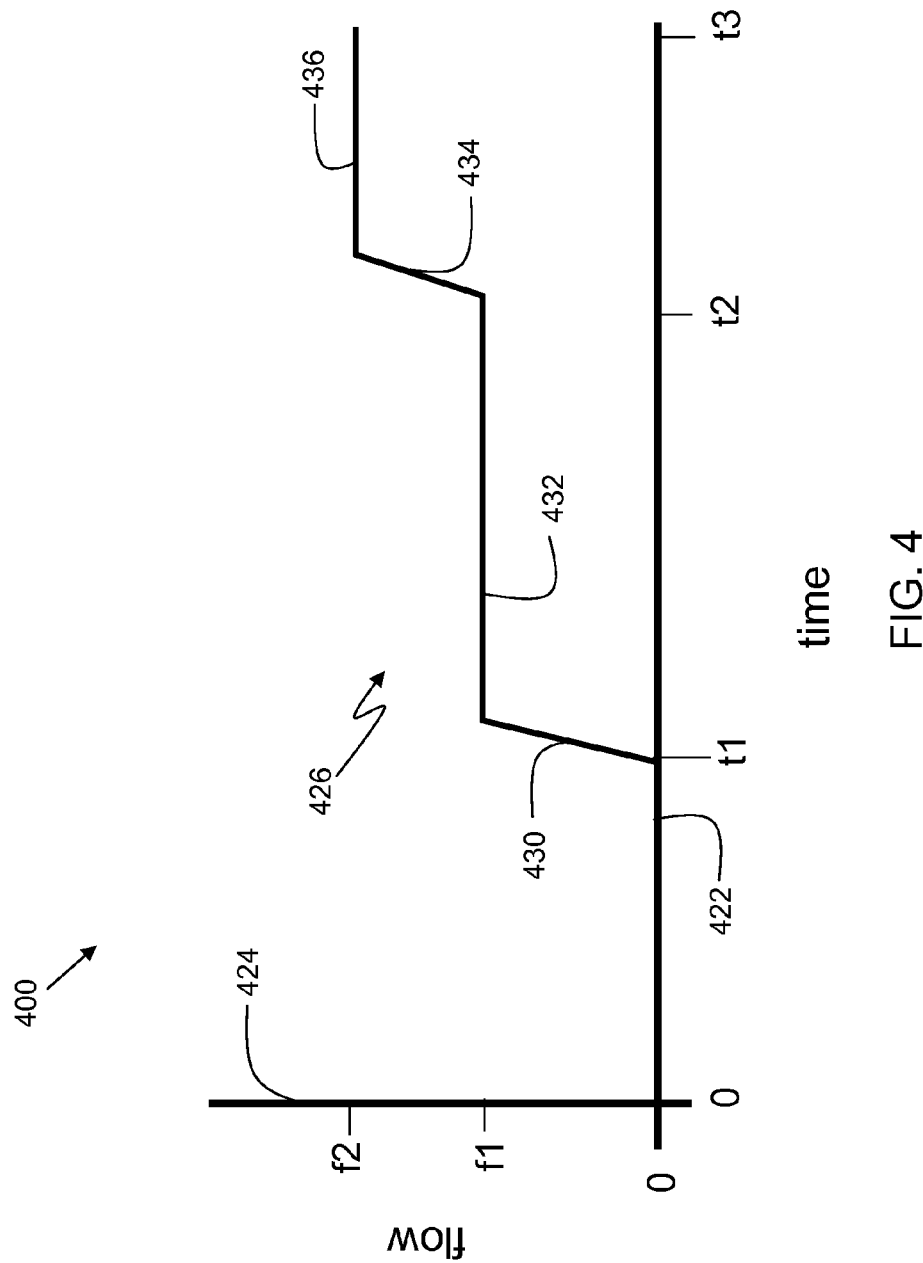
FIG. 4 is an oxygen flow graph indicating three phases of deposition in accordance with illustrative embodiments.

FIG. 4 is an oxygen flow graph 400 indicating three phases of deposition in accordance with illustrative embodiments. The horizontal (X) axis 422 represents time. The vertical (Y) axis 424 represents oxygen gas flow rate. In embodiments, flowable oxide deposition starts at time 0 and proceeds to time t1 with no oxygen gas flowing. In some embodiments, time t1 ranges from about 5 seconds to about 15 seconds, and, in some particular embodiments, may be about 10 seconds. Then at time t1, the oxygen gas flow ramps up to flow rate f1. In some embodiments, flow rate f1 ranges from about 50 standard cubic centimeters per minute (sccm) to about 90 sccm, and in other embodiments may range from about 85 sccm to about 95 sccm. Curve 426 shows the flow rate of oxygen gas as a function of time. The ramp portion 430 of the curve 426 shows the transition from zero flow rate to flow rate f1. In embodiments, the transition time from zero flow rate to flow rate f1 may be about 1 second. The first step portion 432 of the curve 426 shows the oxygen gas continuing at flow rate f1 up until time t2, at which point the flow increases to flow rate f2. In embodiments, the duration between time t1 and time t2 may range from about 20 seconds to about 30 seconds. The ramp portion 434 of curve 426 shows the transition from flow rate f1 to flow rate f2. In embodiments, the transition time from flow rate f1 to flow rate f2 may be about 1 second. The second step portion 436 of the curve 426 shows the oxygen gas continuing at flow rate f2 up until time t3, at which point, the deposition process is complete. In embodiments, the duration between time t2 and time t3 may range from about 20 seconds to about 30 seconds. In embodiments, flow rate f2 may range from about 110 standard cubic centimeters per minute (sccm) to about 160 sccm. In other embodiments, flow rate f2 may range from about 140 sccm to about 180 sccm.

Increasing the oxygen gas flow creates a more dense $SiO_2$ film, hence changing the properties of the flowable oxide. In particular, the viscosity of the flowable oxide is increased, which increases the planarization quality, while decreasing the gap fill quality. Embodiments of the present invention exploit this relationship to use little or no oxygen initially, to have good gap fill quality near the substrate surface, where high aspect ratio shapes are present, and increase the flow of oxygen as the deposition film height increases, where there are no high aspect ratio shapes, but the planarization quality becomes important.

Figure 5:
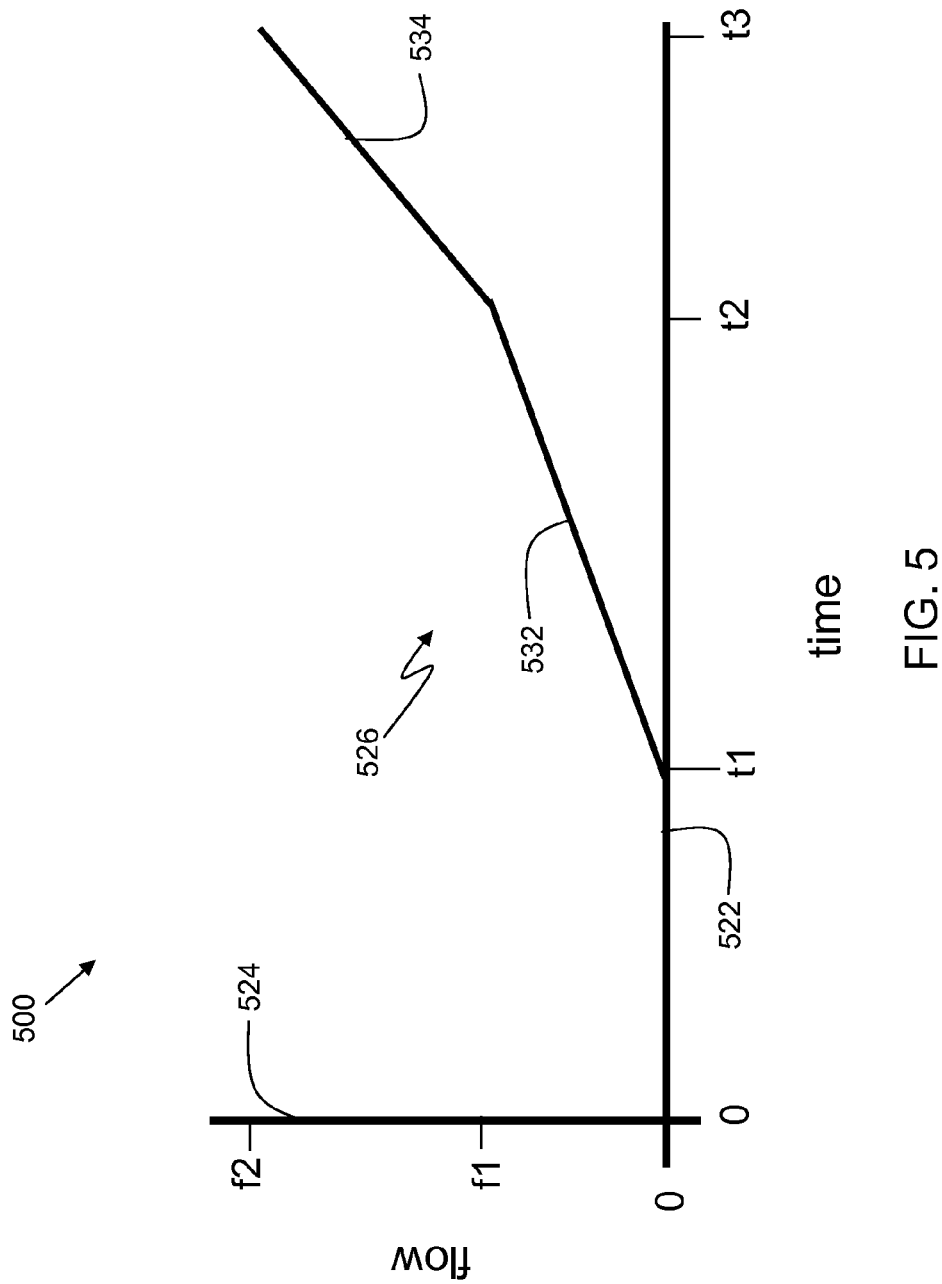
FIG. 5 is an oxygen flow graph indicating a piecewise linear flow profile in accordance with illustrative embodiments.

FIG. 5 is an oxygen flow graph 500 indicating a piecewise linear flow profile in accordance with illustrative embodiments, where the oxygen flow rate increases based on a piecewise linear function as shown by curve 526. The horizontal (X) axis 522 represents time. The vertical (Y) axis 524 represents oxygen gas flow rate. In embodiments, flowable oxide deposition starts at time 0 and proceeds to time t1 with no oxygen gas flowing. In some embodiments, time t1 ranges from about 5 seconds to about 15 seconds, and, in some particular embodiments, may be about 10 seconds. Then at time t1, the oxygen gas flow gradually increases at a first rate of increase, as shown by curve portion 532 of curve 526. In some embodiments, the first rate of increase ranges from about 4 sccm per second to about 6 sccm per second, and the duration between time t1 and t2 is about 20 seconds, such that at time t2, the current flow rate f1 is about 100 sccm. The curve portion 534 of curve 526 represents a second rate of increase up to a flow rate of f2. In some embodiments, the second rate of increase ranges from about 7 sccm per second to about 10 sccm per second. In some embodiments, the flow rate may reach a maximum level and then remain constant at flow level f2. In some embodiments, flow level f2 may range from about 160 sccm to about 200 sccm. In some embodiments, the duration between time t1 and time t2 may range from about 20 seconds to about 40 seconds.

Figure 6:
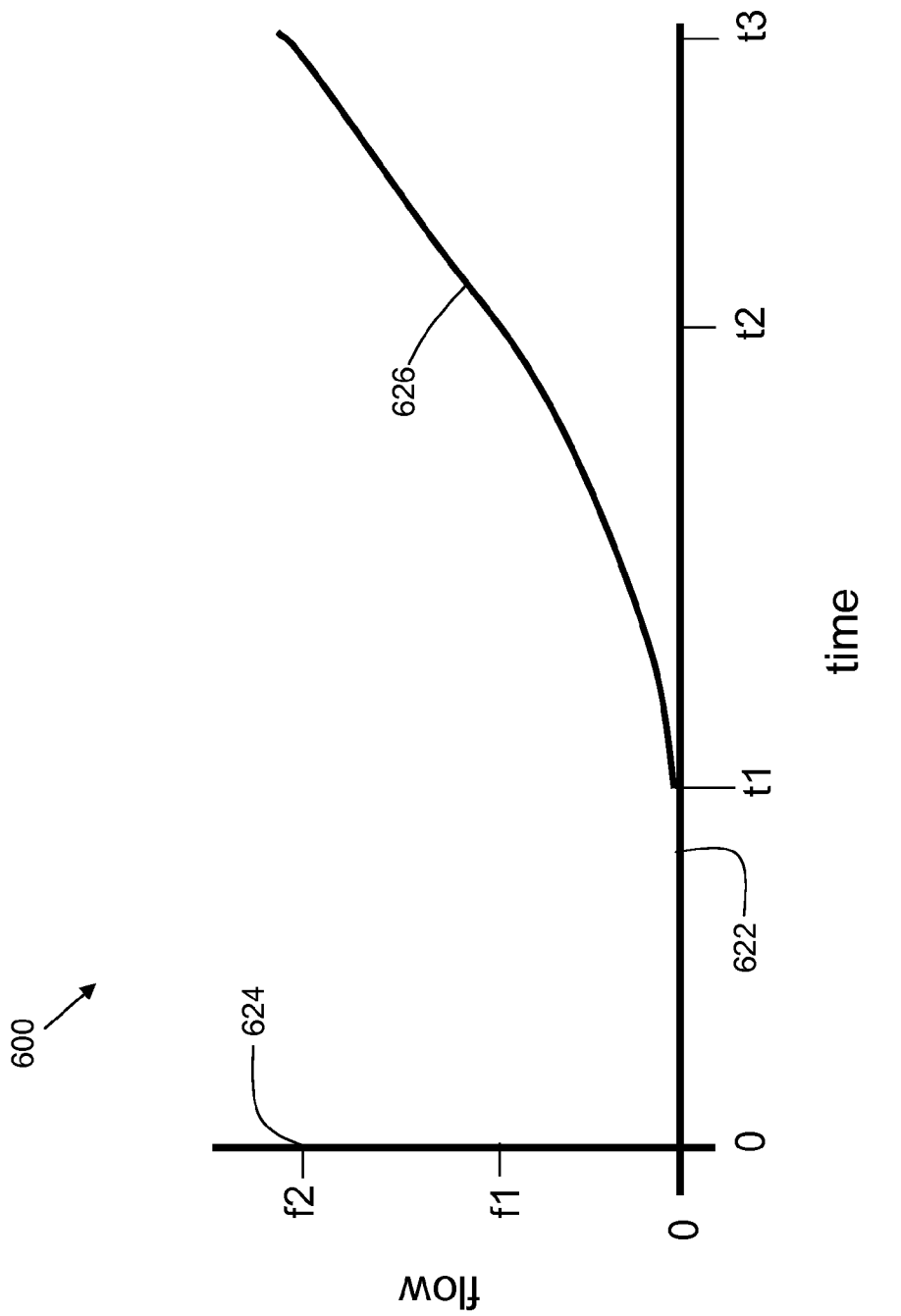
FIG. 6 is an oxygen flow graph indicating a non-linear flow profile in accordance with illustrative embodiments.

FIG. 6 is an oxygen flow graph 600 indicating a non-linear flow profile in accordance with illustrative embodiments. The horizontal (X) axis 622 represents time. The vertical (Y) axis 624 represents oxygen gas flow rate. In embodiments, flowable oxide deposition starts at time 0 and proceeds to time t1 with no oxygen gas flowing. In this embodiment, oxygen gas is flowed at a monotonically increasing flow rate up to an upper flow limit f2 as shown by curve 626. In some embodiments, upper flow limit f2 ranges from about 150 sccm to about 200 sccm. In some embodiments, time t1 ranges from about 5 seconds to about 15 seconds, and, in some particular embodiments, may be about 10 seconds. At time t1, the flow of oxygen gas starts increasing in a non-linear manner. In some embodiments, the flow rate of oxygen gas may be a function of time. In some embodiments, the flow rate of oxygen gas may be described by a function of the form:

$$f=K(1+t-t1)^2$$

Where f is the flow rate, and K is a constant, and t is the current time in seconds. In some embodiments, the constant K may range from about 0.2 to about 0.3. In some embodiments, the difference between time t1 and time t2 may be about 15 seconds, and the difference between time t2 and time t3 may be about 10 seconds. In one embodiment, the value of K is 0.25, and the difference between time t2 and t1 is 10 seconds, and the difference between time t3 and t1 is 25 seconds, such that, at time t2, the current flow rate of oxygen gas f1 may be derived by:

$$f1=0.25(11)^2=30.25 \text{ sccm}$$

And at time t3, the current flow rate of oxygen gas f2 may be derived by:

$$f2=0.25(26)^2=169 \text{ sccm}$$

Figure 7:
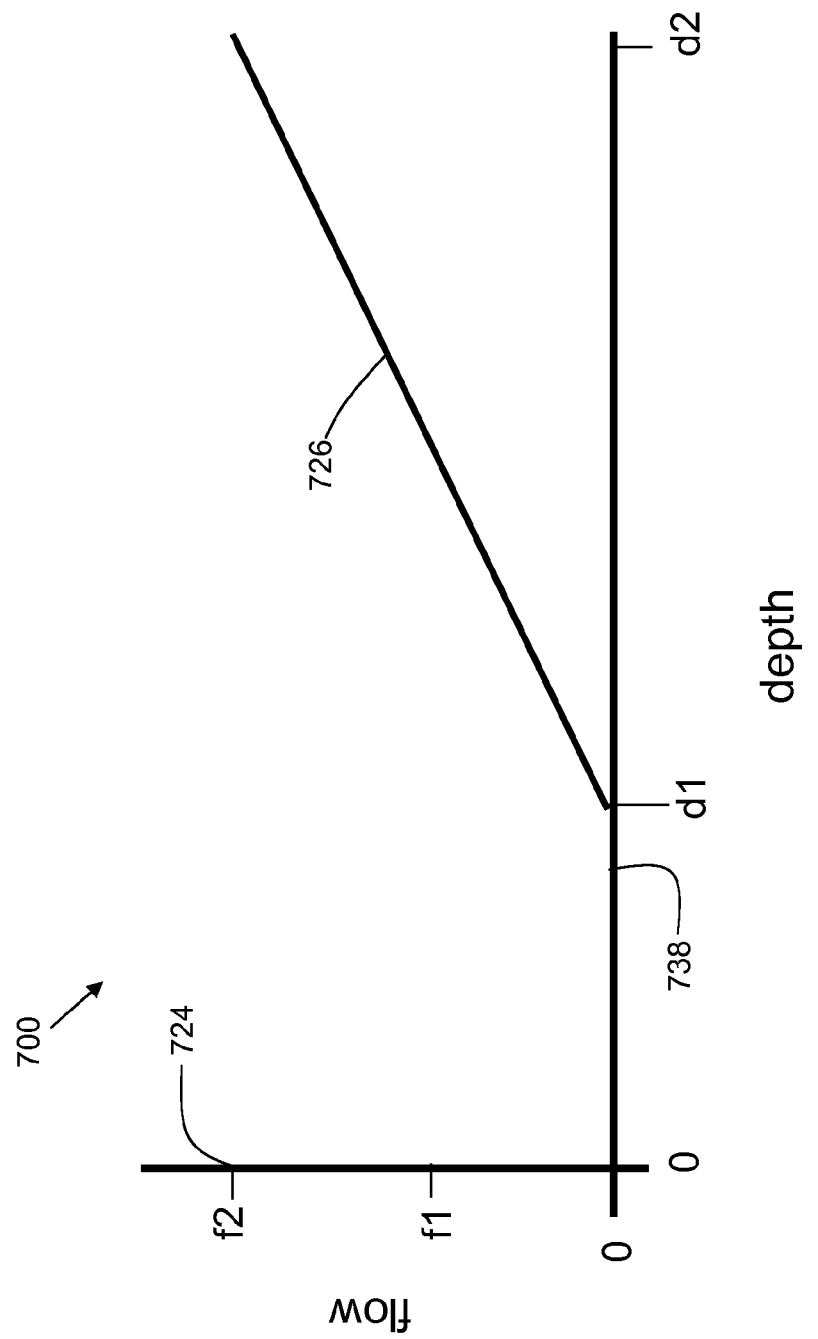
FIG. 7 is an oxygen flow graph indicating a linear flow profile in accordance with illustrative embodiments.

FIG. 7 is an oxygen flow graph 700 indicating a linear flow profile in accordance with illustrative embodiments. The horizontal (X) axis 738 represents depth. The vertical (Y) axis 724 represents oxygen gas flow rate. In this embodiment, the oxygen gas flow rate is a function of deposition depth. In embodiments, an in-situ metrology tool may be used to monitor the flowable oxide film depth in real time, and adjust the flow of oxygen gas accordingly. In embodiments, flowable oxide deposition starts at depth 0 and proceeds to depth d1 with no oxygen gas flowing. In embodiments, depth d1 may range from about 200 angstroms to about 1000 angstroms. Then, at depth d1, the flow rate increases linearly as shown by curve 726, to a depth of d2. In some embodiments, depth d2 may range from about 2500 angstroms to about 3500 angstroms.

Figure 8:
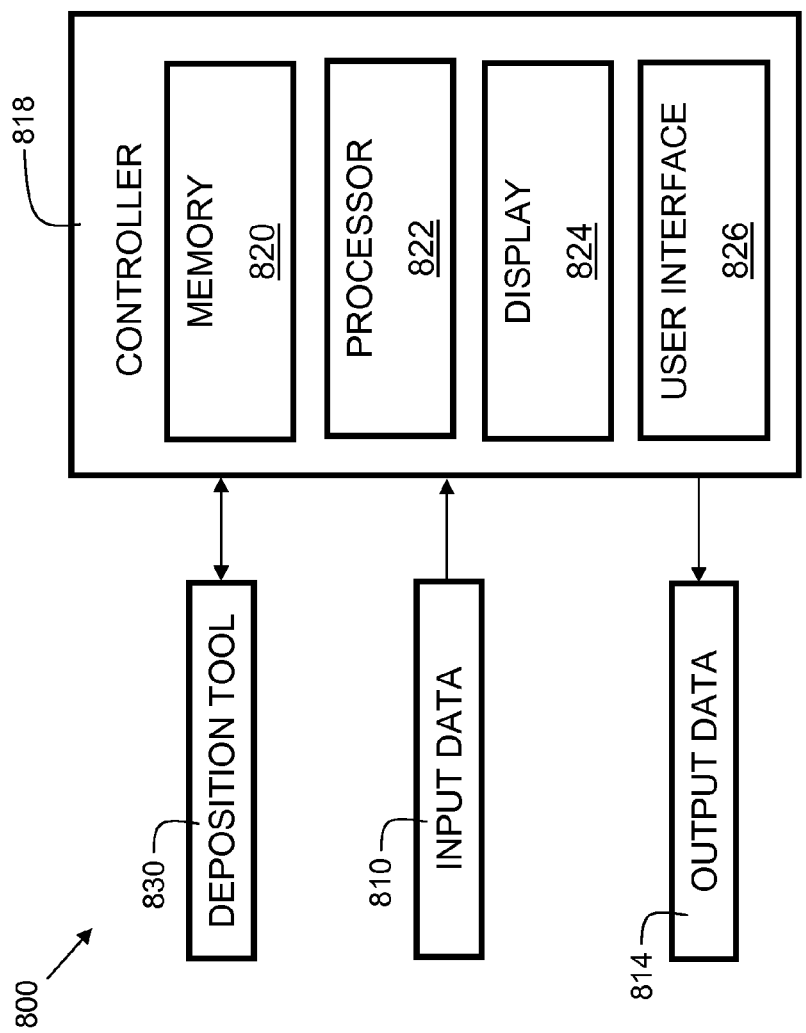
FIG. 8 is a system for implementing illustrative embodiments.

FIG. 8 is a system 800 for implementing illustrative embodiments. System 800 includes a controller 818. Controller 818 may be a computer comprising memory 820, and a processor 822 which is coupled to memory 820, such that the processor 822 may be configured to read and write memory 820. In some embodiments, multiple processors or cores may be used. The memory 820 may be a non-transitory computer-readable medium, such as flash, ROM, non-volatile static ram, or other non-transitory memory. The memory 820 contains instructions that, when executed by processor 822, control the various subsystems to operate system 800. Controller 818 may also include a display 824 and a user interface 826 for interacting with the system 800. The user interface 826 may include a keyboard, touch screen, mouse, or the like.

The controller 818 may be coupled to a deposition tool 830 which may be a chemical vapor deposition tool (CVD) suitable for deposition of flowable oxide. The controller may receive input data 810. Input data 810 may include recipe parameters for depositing flowable oxide in accordance with embodiments of the present invention. Embodiments of the present invention may further include a computer program product embodied in a non-transitory computer-readable medium that implements the multiple phases of deposition as illustrated in FIGS. 4-7.

The controller 818 may also generate output data 814. The generated output data 814 may include deposition simulation data, such as computed flow rates and time durations of each phase to achieve a desired dielectric film quality and thickness under certain process conditions.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a dielectric film comprising:
   depositing a flowable oxide on a semiconductor structure in a first phase having a first oxygen flow rate for a first time interval;
   depositing a flowable oxide on a semiconductor structure in a second phase having a second oxygen flow rate for a second time interval;
   depositing a flowable oxide on a semiconductor structure in a third phase having a third oxygen flow rate for a third time interval, wherein the first oxygen flow rate is zero, and wherein the second oxygen flow rate and the third oxygen flow rate increase based on a piecewise linear function, wherein the second oxygen flow rate increases at a rate of about 4 sccm per second to about 6 sccm per second.

2. The method of claim 1, further comprising performing a planarization process on the deposited flowable oxide.

3. The method of claim 2, wherein performing a planarization process comprises performing a chemical mechanical polish process.

4. The method of claim 1, wherein the third oxygen flow rate is greater than the second oxygen flow rate, and wherein the third oxygen flow rate increases at a rate of about 7 sccm per second to about 10 sccm per second.

5. The method of claim 4, wherein the first time interval ranges from about 5 seconds to about 15 seconds.

6. The method of claim 5, wherein the second time interval ranges from about 20 seconds to about 30 seconds.

7. The method of claim 6, wherein the third time interval ranges from about 20 seconds to about 30 seconds.

* * * * *